US012684701B2

(12) United States Patent
Yang

(10) Patent No.: US 12,684,701 B2
(45) Date of Patent: Jul. 14, 2026

(54) WAVE SOLDERING DEVICE, MANUFACTURING METHOD THEREOF AND PRINTED CIRCUIT BOARD

(71) Applicant: SUZHOU METABRAIN INTELLIGENT TECHNOLOGY CO., LTD., Suzhou (CN)

(72) Inventor: Caikun Yang, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/125,792

(22) PCT Filed: Dec. 25, 2023

(86) PCT No.: PCT/CN2023/141692
§ 371 (c)(1),
(2) Date: Apr. 30, 2025

(87) PCT Pub. No.: WO2024/244437
PCT Pub. Date: Dec. 5, 2024

(65) Prior Publication Data
US 2026/0013050 A1    Jan. 8, 2026

(30) Foreign Application Priority Data

May 26, 2023    (CN) ......................... 202310607937.4

(51) Int. Cl.
*H05K 3/40* (2006.01)
*H05K 1/02* (2006.01)
*H05K 1/11* (2006.01)
(52) U.S. Cl.
CPC ......... *H05K 3/4038* (2013.01); *H05K 1/0272* (2013.01); *H05K 1/116* (2013.01); (Continued)

(58) Field of Classification Search
CPC .... H05K 3/4038; H05K 1/0272; H05K 1/116; H05K 2203/0228; H05K 2203/04; H05K 2203/107
See application file for complete search history.

(56) References Cited

U.S. PATENT DOCUMENTS

| | | | |
|---|---|---|---|
| 6,292,372 | B1 | 9/2001 | Lin et al. |
| 6,407,342 | B1 | 6/2002 | Lee et al. |
| 2017/0094782 | A1 | 3/2017 | Park |

FOREIGN PATENT DOCUMENTS

| | | |
|---|---|---|
| CN | 103687283 A | 3/2014 |
| CN | 104105358 A | 10/2014 |

(Continued)

OTHER PUBLICATIONS

The search report of CN application No. 202310607937.4 issued on Jul. 11, 2023.

(Continued)

*Primary Examiner* — Jeremy C Norris
(74) *Attorney, Agent, or Firm* — Scully, Scott, Murphy & Presser, P.C.

(57) ABSTRACT

A wave soldering device, a manufacturing method thereof and a printed circuit board are provided. The wave soldering device includes: a substrate including a front surface and a back surface opposite to each other; a target hole group including a pad through-hole, a plurality of pad through-holes are provided and distributed at intervals along a first direction, the plurality of pad through-holes penetrate through the front surface and the back surface of the substrate; a virtual hole group including a virtual hole, a plurality of virtual holes are provided, the plurality of virtual holes penetrate through the back surface of the substrate, the plurality of virtual holes are located on the same side of the plurality of pad through-holes in a one-to-one correspon- (Continued)

dence, a diameter of the virtual hole is less than a diameter of the pad through-hole.

20 Claims, 5 Drawing Sheets

(52) U.S. Cl.
CPC . *H05K 2203/0228* (2013.01); *H05K 2203/04* (2013.01); *H05K 2203/107* (2013.01)

(56) References Cited

FOREIGN PATENT DOCUMENTS

| | | | |
|----|-----------|---|---------|
| CN | 106102316 | A | 11/2016 |
| CN | 209994630 | U | 1/2020  |
| CN | 217789987 | U | 11/2022 |
| CN | 116390341 | A | 7/2023  |

OTHER PUBLICATIONS

International Search Report of International Application No. PCT/CN2023/141692 issued on Mar. 20, 2024.

Fig. 6

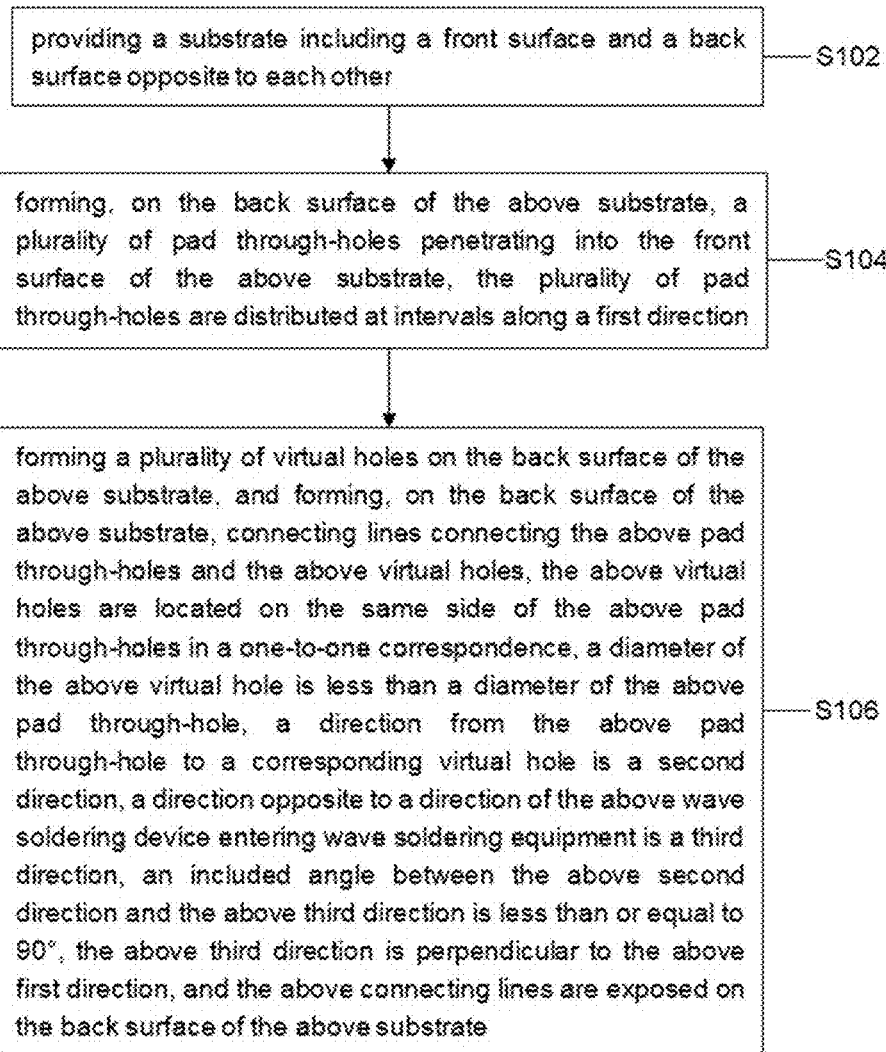

providing a substrate including a front surface and a back surface opposite to each other —— S102 forming, on the back surface of the above substrate, a plurality of pad through-holes penetrating into the front surface of the above substrate, the plurality of pad through-holes are distributed at intervals along a first direction —— S104 forming a plurality of virtual holes on the back surface of the above substrate, and forming, on the back surface of the above substrate, connecting lines connecting the above pad through-holes and the above virtual holes, the above virtual holes are located on the same side of the above pad through-holes in a one-to-one correspondence, a diameter of the above virtual hole is less than a diameter of the above pad through-hole, a direction from the above pad through-hole to a corresponding virtual hole is a second direction, a direction opposite to a direction of the above wave soldering device entering wave soldering equipment is a third direction, an included angle between the above second direction and the above third direction is less than or equal to 90°, the above third direction is perpendicular to the above first direction, and the above connecting lines are exposed on the back surface of the above substrate —— S106

WAVE SOLDERING DEVICE, MANUFACTURING METHOD THEREOF AND PRINTED CIRCUIT BOARD

CROSS-REFERENCE TO RELATED APPLICATIONS

The present disclosure is a National Stage Filing of the PCT International Application No. PCT/CN2023/141692 filed on Dec. 25 2023, which claims priority to and the benefit of the Chinese Patent Application filed with the China National Intellectual Property Administration (CNIPA) on May 26, 2023, with the application number 202310607937.4, entitled "WAVE SOLDERING DEVICE, MANUFACTURING METHOD THEREOF AND PRINTED CIRCUIT BOARD", the entire disclosures of each of which are herein incorporated by reference.

TECHNICAL FIELD

The present disclosure relates to the technical field of anti-bridging during soldering, and in particular to a wave soldering device, a manufacturing method thereof and a printed circuit board.

BACKGROUND

In the process of wave soldering of a PCB (printed circuit board), problems such as poor soldering often occur, among which the bridging between the pins of the wave soldering device is a major problem. When the spacing between the pins of the wave soldering device is less than 2 mm (millimeter), the problem of solder bridging is difficult to solve, and there are multiple reasons for this problem. From the perspective of PCB design, it is mainly due to the unreasonable packaging design of the wave soldering device and the unreasonable wiring design around the wave soldering device in the PCB design process. This leads to excessively rapid heat dissipation at the bottom surface of device pins during wave soldering of the device, and at the same time, too much solder is applied, making it difficult to separate the solder, thereby causing bridging between the pins. This welding problem has always been a thorny technical problem in the field of PCB welding.

SUMMARY

The present disclosure provides a wave soldering device, a manufacturing method thereof and a printed wiring board, so as to at least solve the problem of solder bridging of the wave soldering device in the soldering process in the related art.

Some embodiments of the present disclosure, provide a wave soldering device, including: a substrate including a front surface and a back surface opposite to each other; a target hole group including a pad through-hole, a plurality of pad through-holes are provided and distributed at intervals along a first direction, the plurality of pad through-holes penetrate through the front surface and the back surface of the substrate; a virtual hole group including a virtual hole, a plurality of virtual holes are provided, the plurality of virtual holes penetrate through the back surface of the substrate, the plurality of virtual holes are located on the same side of the plurality of pad through-holes in a one-to-one correspondence, a diameter of the virtual hole is less than a diameter of the pad through-hole, a direction from the pad through-hole to the corresponding virtual hole is a second direction, a direction opposite to a direction of the wave soldering device entering a wave soldering equipment is a third direction, an included angle between the second direction and the third direction is less than or equal to 90°, and the third direction is perpendicular to the first direction; and a connecting line, a plurality of connecting lines are provided and located on the back surface of the substrate, the plurality of virtual holes and the plurality of pad through-holes are connected in a one-to-one correspondence through the plurality of connecting lines.

In some embodiments, there are at least two target hole groups, the at least two target hole groups are distributed at intervals along the third direction, and the virtual hole group is located on the same side of the at least two target hole groups.

In some embodiments, there are a plurality of target hole groups and a plurality of virtual hole groups, and the plurality of target hole groups and the plurality of virtual hole groups are alternately distributed at intervals along the third direction.

In some embodiments, the wave soldering device includes a first quantity of the target hole groups and a second quantity of the virtual hole groups, the first quantity is greater than the second quantity, the first quantity of the target hole groups are distributed at intervals along the third direction, and the second quantity of the target hole groups distributed at a tail along the third direction and the second quantity of the virtual hole groups are alternately distributed at intervals along the third direction.

In some embodiments, the plurality of virtual holes include at least one of the following: a through-hole and a blind hole.

In some embodiments, when the plurality of virtual holes include the blind hole, the wave soldering device further includes: a groove located between the pad through-hole and corresponding blind hole, one end of the groove is in communication with the pad through-hole, the other end of the groove is in communication with the blind hole, a depth of the groove gradually increases along a direction close to the blind hole, and the connecting line is located in the groove.

In some embodiments, when the plurality of virtual holes include the blind hole, the smaller a spacing between adjacent pad through-holes, the greater a depth of the corresponding blind hole.

In some embodiments, when the plurality of virtual holes include the blind hole, a depth of the blind hole is 0.1 mm to 0.6 mm.

In some embodiments, a diameter of an end of the virtual hole is a first diameter, a diameter of other position of the virtual hole except the end is a second diameter, and the first diameter is less than the second diameter.

In some embodiments, the diameter of the virtual hole is 0.4 mm to 0.6 mm.

In some embodiments, a spacing between the pad through-hole and the corresponding virtual hole is 0.5 mm to 0.6 mm.

In some embodiments, the wave soldering device further includes: a component with a pin located on the front surface of the substrate, and the pin is located in the pad through-hole.

In some embodiments, a diameter of the pin is 0.3 mm to 0.5 mm less than the diameter of the plurality of pad through-holes.

In some embodiments, the connecting line include mask opening copper foil.

In some embodiments, a width of the connecting line is 0.4 mm to 0.6 mm.

In some embodiments, a spacing between any two adjacent pad through-holes is less than 2 mm.

In some embodiments, the second direction is parallel to the third direction.

Some other embodiments of the present disclosure, provide a manufacturing method for a wave soldering device, including: providing a substrate including a front surface and a back surface opposite to each other; forming, on the back surface of the substrate, a pad through-hole penetrating into the front surface of the substrate, a plurality of pad through-holes are provided, and the plurality of pad through-holes are distributed at intervals along a first direction; and forming a virtual hole on the back surface of the substrate, a plurality of virtual holes are provided, and forming, on the back surface of the substrate, a connecting line connecting the pad through-hole and the virtual hole, and the plurality of virtual holes are located on the same side of the plurality of pad through-holes in a one-to-one correspondence, a diameter of the virtual hole is less than a diameter of the pad through-hole, a direction from the pad through-hole to the corresponding virtual hole is a second direction, a direction opposite to a direction of the wave soldering device entering wave soldering equipment is a third direction, an included angle between the second direction and the third direction is less than or equal to 90°, the third direction is perpendicular to the first direction, and the connecting lines are exposed on the back surface of the substrate.

In some embodiments, in a step of forming the plurality of virtual holes on the back surface of the substrate and forming, on the back surface of the substrate, the connecting line connecting the pad through-hole and the virtual hole, the manufacturing method include: forming a plurality of connecting lines on the back surface of the substrate along the second direction, and first ends of the plurality of connecting lines are located in the plurality of pad through-holes in a one-to-one correspondence; and forming a blind hole penetrating into the substrate at a second end of each of the plurality of connecting lines by laser drilling technology, so that the second end of each of the plurality of connecting lines is located in the blind hole, thereby obtaining the plurality of virtual holes.

In some embodiments, in a step of forming the plurality of virtual holes on the back surface of the substrate and forming, on the back surface of the substrate, the connecting line connecting the pad through-hole and the virtual hole, the manufacturing method include: correspondingly forming, on the same side of each of the plurality of pad through-holes by using a drill bit, a blind hole penetrating into the substrate to obtain the plurality of virtual holes; and forming the connecting line connecting the pad through-hole and the virtual hole.

In some embodiments, in a step of forming the plurality of virtual holes on the back surface of the substrate and forming, on the back surface of the substrate, the connecting line connecting the pad through-hole and the virtual hole, the manufacturing method include: removing a part of the substrate starting from each of the plurality of pad through-holes along the second direction by using a milling cutter to form a plurality of preliminary grooves with sequentially increasing depths, forming blind holes at ends of the plurality of preliminary grooves to obtain the plurality of virtual holes, and forming grooves with remaining preliminary grooves; and forming a plurality of connecting lines are provided in each of the grooves in a one-to-one correspondence.

In some embodiments, in a step of forming the plurality of virtual holes on the back surface of the substrate, the manufacturing method includes: forming, on the back surface of the substrate, a plurality of through-holes penetrating through the front surface of the substrate to obtain the plurality of virtual holes.

Still some other embodiments of the present disclosure, further provide a printed circuit board, including: any one of the above wave soldering devices, or including a wave soldering device manufactured by using any one of the above methods.

According to the present disclosure, the plurality of virtual holes are arranged on the same side of the plurality of pad through-holes distributed at intervals along the first direction on the substrate, and the diameter of the virtual hole is less than the diameter of the pad through-hole. The plurality of pad through-holes and the plurality of virtual holes are connected in a one-to-one correspondence by connecting lines located on the back surface of the substrate, resulting in a structure where large pad through-holes are connected to small virtual holes. The direction from the pad through-hole to the corresponding virtual hole is the second direction, and the direction opposite to the direction of the wave soldering device entering the wave soldering equipment is a third direction. The included angle between the second direction and the third direction is less than or equal to 90°. In an embodiment, along the direction opposite to the direction of the wave soldering device entering the wave soldering equipment, i.e., along a flow direction of solder during wave soldering, the virtual holes are located above, below or behind the pad through-holes. When the virtual holes are located behind the pad through-holes, the virtual holes is able to be directly behind or diagonally behind the pad through-holes. In this way, during the wave soldering with the wave soldering device, an excess solder in the pad through-holes may flow along the connecting lines to the corresponding virtual holes. Due to the smaller diameter of the virtual holes, the virtual holes essentially do not get soldered during the wave soldering, allowing the virtual holes to have space to accommodate the excess solder from the pad through-holes. This achieves the effect of drawing away the excess solder from the pad through-holes, solving a problem of bridging between pins caused by excessive solder in the pad through-holes, and ensuring a better soldering effect and a higher soldering yield of the wave soldering device.

BRIEF DESCRIPTION OF THE DRAWINGS

FIG. 6 is a schematic flow diagram of a manufacturing method for a wave soldering device according to an embodiment of the present disclosure.

Figure 1:
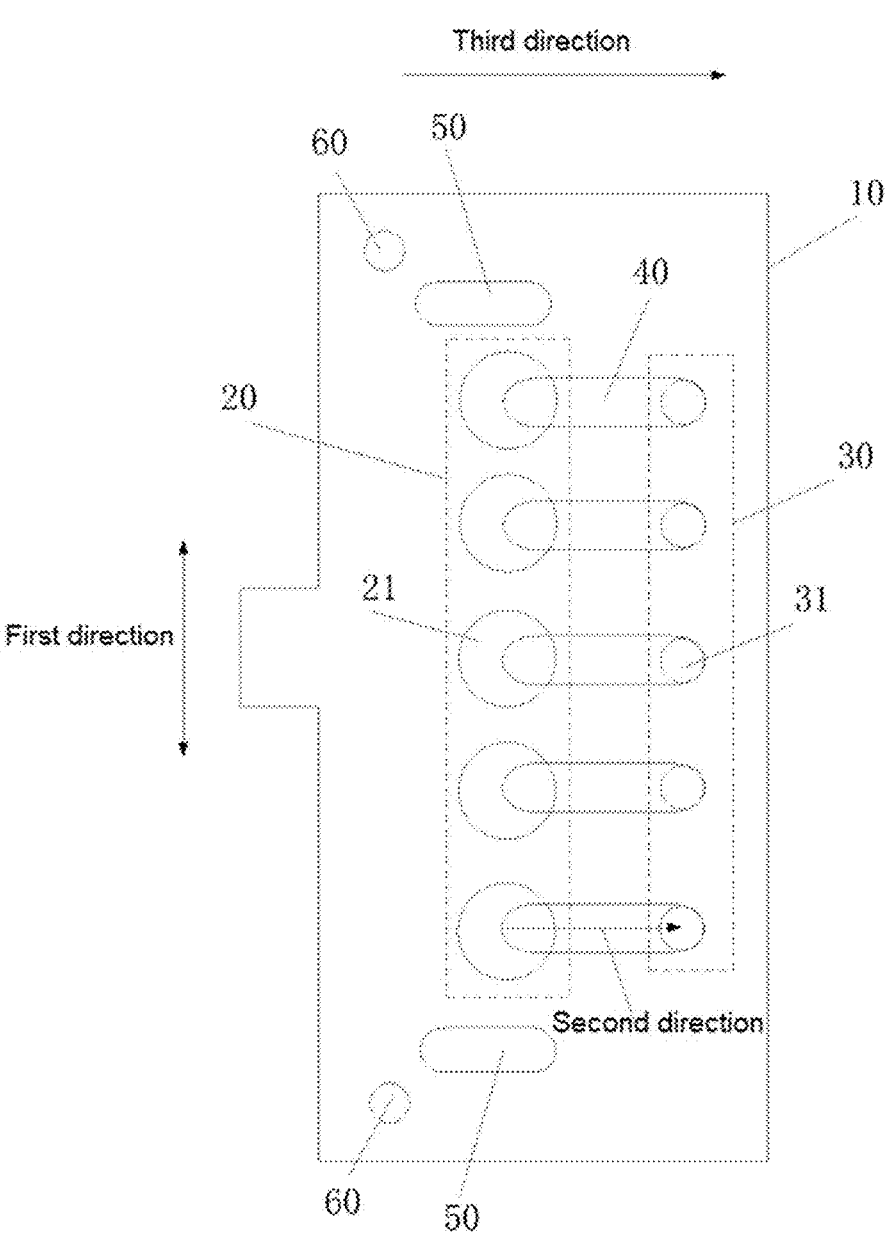
FIG. 1 is a schematic structural diagram of a wave soldering device according to an embodiment of the present disclosure.

The above drawings include the following reference numerals:

10. substrate; 20. target hole group; 21. pad through-hole; 30. virtual hole group; 31. virtual hole; 40. connecting line; 50. slot hole; 60. positioning hole.

DETAILED DESCRIPTION OF THE EMBODIMENTS

Embodiments of the present disclosure will be described in detail below with reference to the drawings and in conjunction with embodiments.

It should be noted that the terms "first", "second", etc. in the description and claims of the present disclosure and in the above drawings are configured to distinguish similar objects, and are not necessarily configured to describe a specific order or sequence.

In the embodiment, a wave soldering device is provided. The wave soldering device of the present disclosure is a device that requires wave soldering to connect components and circuit boards. FIG. 1 is a schematic structural diagram of the wave soldering device according to the embodiment of the present disclosure. As shown in FIG. 1, the wave soldering device includes:

a substrate 10 including a front surface and a back surface opposite to each other;

a target hole group 20 including a plurality of pad through-holes 21 distributed at intervals along a first direction, the plurality of pad through-holes 21 penetrate through the front surface of the above substrate 10 and the back surface of the above substrate 10;

a virtual hole group 30 including a plurality of virtual holes 31, the plurality of virtual holes 31 penetrate through the back surface of the above substrate 10, the above virtual holes 31 are located on the same side of the above pad through-holes 21 in a one-to-one correspondence, a diameter of the above virtual hole 31 is less than a diameter of the above pad through-hole 21, a direction from the above pad through-hole 21 to the corresponding virtual hole 31 is a second direction, a direction opposite to a direction of the above wave soldering device entering the wave soldering equipment is a third direction, an included angle between the above second direction and the above third direction is less than or equal to 90°, and the above third direction is perpendicular to the above first direction; and a plurality of connecting lines 40 located on the back surface of the above substrate 10, the above virtual holes 31 and the above pad through-holes 21 are connected in a one-to-one correspondence through the above connecting lines 40.

According to the above embodiments of the present disclosure, the plurality of virtual holes are arranged on the same side of the plurality of pad through-holes distributed at intervals along the first direction on the substrate, and the diameter of the virtual hole is made less than the diameter of the pad through-hole. The plurality of pad through-holes and the plurality of virtual holes are connected in a one-to-one correspondence by connecting lines located on the back surface of the substrate, resulting in a structure where large pad through-holes are connected to small virtual holes. The direction from the above pad through-hole to the above corresponding virtual hole is the second direction, and the direction opposite to the direction of the above wave soldering device entering the wave soldering equipment is a third direction. The included angle between the second direction and the third direction is less than or equal to 90°.

In the embodiment, along the direction opposite to the direction of the above wave soldering device entering the wave soldering equipment, i.e., along a flow direction of solder during wave soldering, the above virtual holes are located above, below or behind the above pad through-holes. When the above virtual holes are located behind the above pad through-holes, the above virtual holes is able to be directly behind or diagonally behind the above pad through-holes. In this way, during the wave soldering with the wave soldering device, an excess solder in the pad through-holes may flow along the connecting lines to the corresponding virtual holes. Due to the smaller diameter of the virtual holes, the virtual holes essentially do not get soldered during the wave soldering, allowing the virtual holes to have space to accommodate the excess solder from the pad through-holes. This achieves the effect of drawing away the excess solder from the pad through-holes, solving a problem of solder bridging between pins caused by excessive solder in the pad through-holes, and ensuring a better soldering effect and a higher soldering yield of the wave soldering device.

In an embodiment, for pad through-holes located at a head or a tail along the above first direction, the included angle between the second direction of the pad through-hole being connected to the corresponding virtual hole and the third direction may be 90° or less than 90°. In other words, for the pad through-holes located at the head or the tail along the above first direction, the corresponding virtual holes may be located on a side, away from other pad through-holes, of the pad through-holes at the head or the tail along the above first direction; and the corresponding virtual holes may also be located behind the pad through-holes at the head or the tail along the flow direction of the solder during the wave soldering. However, for other pad through-holes except the pad through-holes at the head or the tail, due to a spacing limitation between the pad through-holes, the virtual holes are generally located behind (directly behind or diagonally behind) the pad through-holes along the flow direction of the solder during the wave soldering.

In an embodiment, as shown in FIG. 1, the above plurality of virtual holes 31 are located on the same side of the above plurality of pad through-holes 21 in a one-to-one correspondence, which means that the above plurality of virtual holes 31 correspond one-to-one to the above plurality of pad through-holes 21, and the plurality of virtual holes 31 are all located on the same side of the corresponding pad through-holes 21. For the convenience of understanding, an example is given as follows: there are three virtual holes, i.e. a first virtual hole, a second virtual hole and a third virtual hole, and there are also three pad through-holes, i.e. a first pad through-hole, a second pad through-hole and a third pad through-hole. The above first virtual hole corresponds to the above first pad through-hole and is located on a right side of the above first pad through-hole; the above second virtual hole corresponds to the above second pad through-hole and is located on a right side of the above second pad through-hole; and the above third virtual hole corresponds to the above third pad through-hole and is located on a right side of the above third pad through-hole. In this case, the above second direction is a direction from left to right. Since the included angle between the third direction and the second direction is less than or equal to 90°, the above third direction is a direction located in a first quadrant and a fourth quadrant, or a positive direction of the y-axis, or a negative direction of the y-axis.

In addition, the above third direction is also the flow direction of the solder during the wave soldering. The included angle between the above second direction and the above third direction is less than 90°, which means that along the third direction, the virtual holes are located behind the corresponding pad through-holes. The virtual holes may be located directly behind (corresponding to an included angle of) 0° or diagonally behind (corresponding to a non-0° included angle less than) 90° the corresponding pad through-holes. The included angle between the above second direction and the above third direction is equal to 90°, which means that the above second direction coincides with the above first direction, and the virtual holes are located on a side of the pad through-holes along the first direction.

It should be noted that the above connecting lines are exposed on the back surface of the above substrate. In other words, surfaces of the above connecting lines are not covered with ink.

The plurality of virtual holes may be distributed at intervals along the above first direction; and the virtual holes may also be arranged in a staggered manner instead of being regularly arranged along the above first direction. The virtual holes may be flexibly arranged according to a routing situation on the substrate, as long as the virtual holes are located behind the corresponding pad through-holes along the third direction and avoid a routing area.

The above substrate may be a copper-clad laminate, or a gold-plated board, a paper substrate, an epoxy glass fiber cloth substrate, and substrates of other materials. The above virtual holes are able to penetrate from the back surface of the above substrate to the front surface of the substrate, or penetrate from the back surface of the above substrate into the above substrate without penetrating through the front surface of the substrate. One end of the above connecting line connecting the above pad through-hole and the above virtual hole is located in the above pad through-hole, and the other end is located in the above virtual hole.

In an embodiment, the included angle between the above second direction and the above third direction may be arranged to angles such as 10°, 15°, 20° and 45°. Since the substrate is generally in a regular rectangular shape, in order to ensure that an overall occupied area of the pad through-holes and the virtual holes is relatively small, so as to increase wiring area for other signal traces of the wave soldering device and further realize miniaturization and integration design of the wave soldering device, in some embodiments, as shown in FIG. 1, the included angle between the above second direction and the above third direction is 0°. In other words, the above second direction is parallel to the above third direction.

Figure 2:
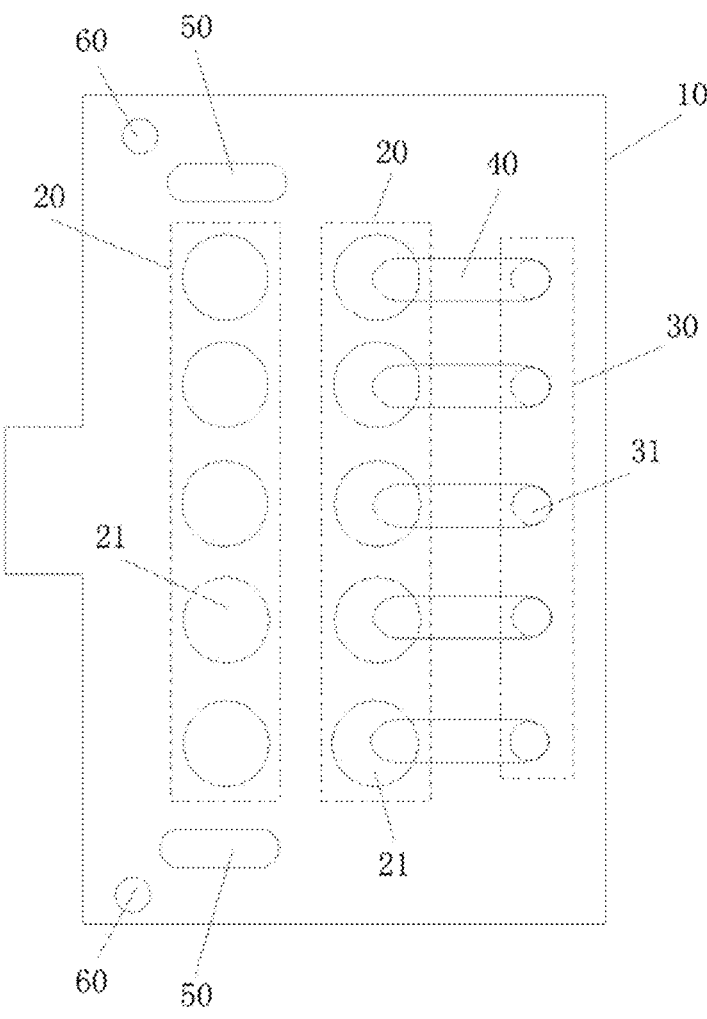
FIG. 2 is another schematic structural diagram of a wave soldering device according to an embodiment of the present disclosure.

In some embodiments of the present disclosure, as shown in FIG. 2, there are at least two target hole groups 20. The at least two target hole groups 20 are distributed at intervals along the above third direction, and the above virtual hole group 30 is located on the same side of the at least two target hole groups 20. In the embodiment, when the above wave soldering device includes at least two rows of pad through-holes, along the third direction, except pad through-holes in a last row, pad through-holes in other rows are arranged conventionally without design of connecting large through-holes to small virtual holes. Only a row of virtual holes is formed behind the pad through-holes in the last row. During the wave soldering, the excessive solder in the pad through-holes in the last row will flow through the connecting lines into corresponding virtual holes, reducing solder in the pad through-holes in the last row. This may avoid the problem of bridging between the pad through-holes in the last row and between the pad through-holes in the last row and pad through-holes in an adjacent row, thereby further avoiding the problem of bridging between pins. Since there is only a row of virtual hole groups, it may also prevent the virtual hole groups from occupying excessive substrate area, thereby facilitating design of other signal traces of the wave soldering device and realizing the miniaturization design of the wave soldering device.

In an actual application process, the above target hole group is generally single-row or double-row. When the above target hole group is single-row, the virtual holes in the above virtual hole group are connected to single-row pad through-holes in a one-to-one correspondence, and the virtual holes are configured to draw the excess solder in the pad through-holes. When the above target hole group is double-row, a first row of pad through-holes, a second row of pad through-holes and the virtual hole group are arranged in sequence along the above third direction. The second row of pad through-holes is connected to the virtual holes in the virtual hole group in a one-to-one correspondence. Along the direction of the above wave soldering device entering the wave soldering equipment, the above first row of pad through-holes and the above second row of pad through-holes are soldered in sequence. After a peak of solder application, an excess solder in the second row of pad through-holes will flow through the above connecting lines into the above virtual holes behind the above second row of pad through-holes. Since the excess solder in the second row of pad through-holes has flowed into the virtual holes, solder between the first row of pad through-holes and the second row of pad through-holes is reduced, thereby causing no solder bridging problem between the second row of pad through-holes and between the second row of pad through-holes and the first row of pad through-holes.

Figure 3:
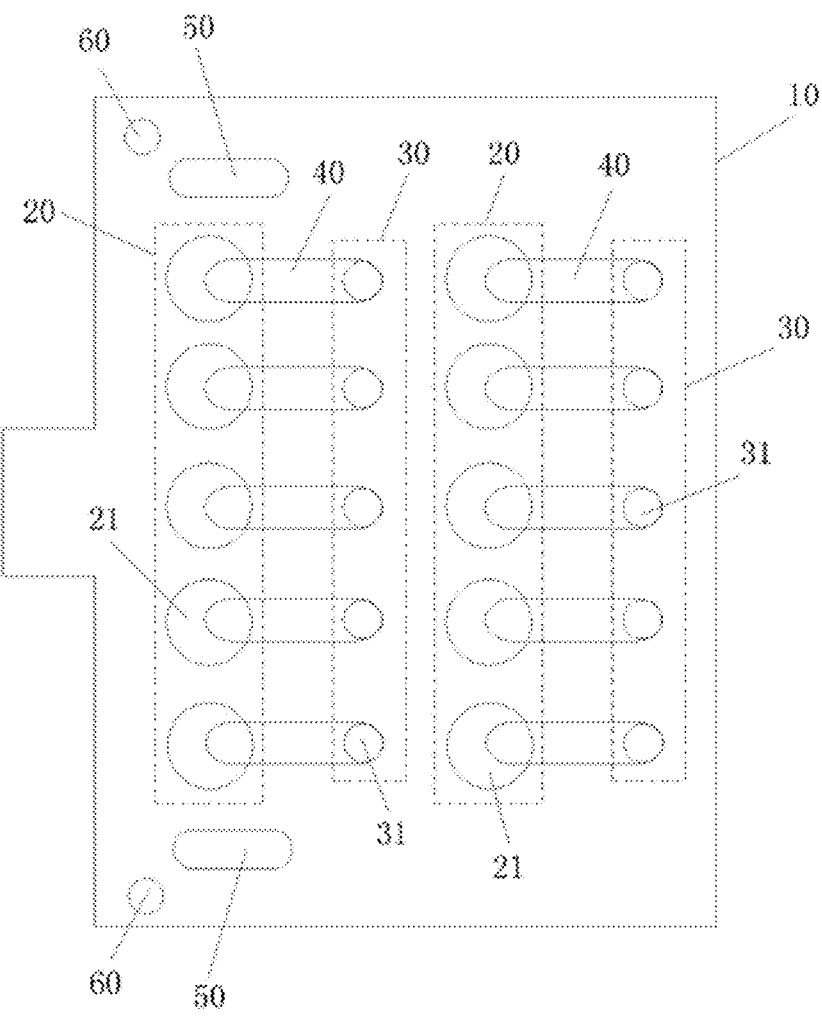
FIG. 3 is yet another schematic structural diagram of a wave soldering device according to an embodiment of the present disclosure.

In some embodiments, as shown in FIG. 3, there are a plurality of target hole groups 20 and a plurality of virtual hole groups 30. The plurality of target hole groups 20 and the plurality of virtual hole groups 30 are alternately distributed at intervals along the above third direction. In other words, a first row of target hole groups, a first row of virtual hole groups, a second row of target hole groups, a second row of virtual hole groups, . . . are arranged in sequence along the third direction. Through the plurality of virtual holes in each row, an excess solder in each row of the plurality of pad through-holes may be drawn, further solving the problem of solder bridging.

Figure 4:
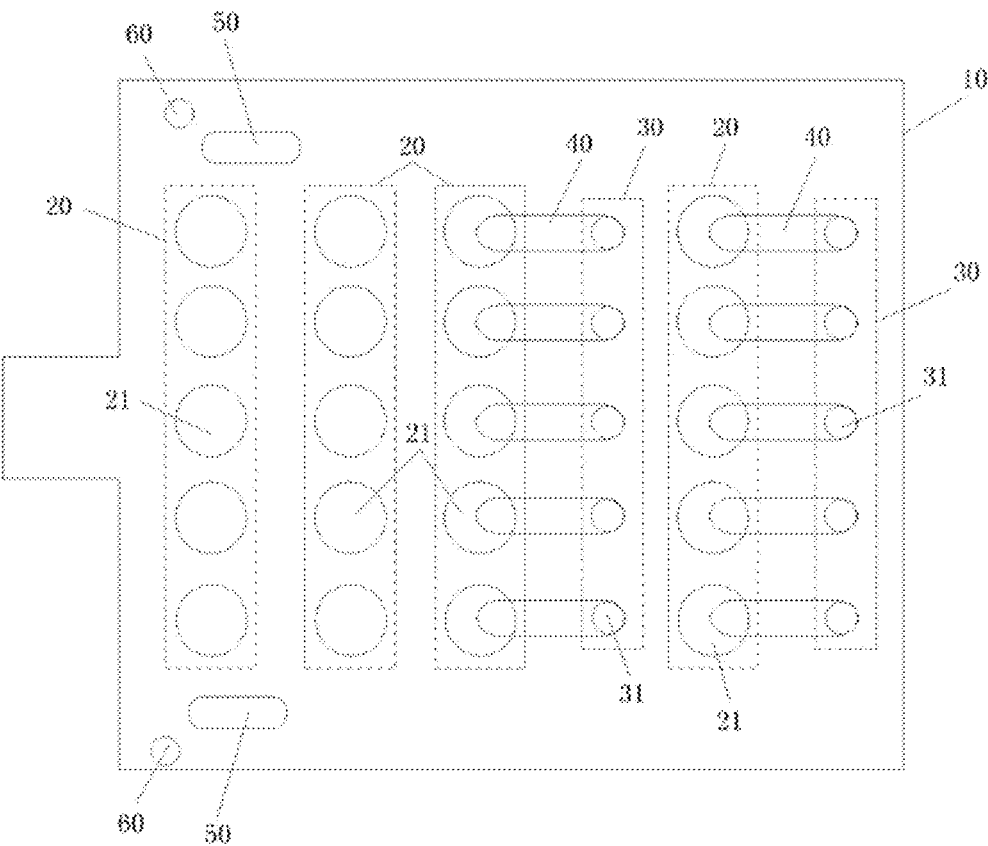
FIG. 4 is still another schematic structural diagram of a wave soldering device according to an embodiment of the present disclosure.

Due to limitations of layout and wiring, in an actual application process, when there are a plurality of target hole groups, it is impossible to arrange corresponding virtual hole groups behind each target hole group along the above third direction. In this case, in order to further avoid the problem of solder bridging and further realize the miniaturization of the wave soldering device, according to other embodiments of the present disclosure, as shown in FIG. 4, the above wave soldering device includes a first quantity of the above target hole groups 20 and a second quantity of the above virtual hole groups 30. The above first quantity is greater than the above second quantity. The plurality of target hole groups 20 are distributed at intervals along the above third direction. The second quantity of the above target hole groups 20 distributed at the tail along the above third direction and the second quantity of the above virtual hole groups 30 are alternately distributed at intervals along the above third direction. In the above embodiments of the present disclosure, when there are a plurality of rows of target hole groups, along the flow direction of the solder during the wave soldering (i.e., the above third direction), the virtual hole groups are only arranged behind last few rows of target hole groups. While further avoiding the problem of solder bridging, it also prevents excessive virtual hole groups from occupying layout and wiring area of the wave soldering device, thereby further realizing the miniaturization design of the wave soldering device.

For the convenience of understanding, the above solution will be explained and illustrated below in conjunction with specific embodiments. For example, when the first quantity is 5 and the second quantity is 2, there are respectively a first target hole group, a second target hole group, a third target hole group, a fourth target hole group and a fifth target hole group distributed at intervals along the above third direction, as well as a first virtual hole group and a second virtual hole group distributed at intervals along the above third direction. The second quantity of the above target hole groups distributed at the tail along the above third direction refers to the fourth target hole group and the fifth target hole group. The second quantity of the above target hole groups distributed at the tail along the above third direction and the above virtual hole groups are alternately distributed at intervals along the above third direction. In other words, the first virtual hole group is located between the fourth target hole group and the fifth target hole group, and the second virtual hole group is located on a side of the fifth target hole group away from the fourth target hole group.

Of course, in addition to the above solution, when the above wave soldering device includes the first quantity of the above target hole groups and the second quantity of the above virtual hole groups, each of the virtual hole groups may also be randomly arranged behind the target hole groups along the above third direction. Taking a solution with the first quantity of 5 and the second quantity of 2 as an example, there are respectively a first target hole group, a second target hole group, a third target hole group, a fourth target hole group and a fifth target hole group distributed at intervals along the above third direction. The above first virtual hole group may be arranged behind the first target hole group, i.e., between the first target hole group and the second target hole group, and the above second virtual hole group may be arranged behind the fourth target hole group, i.e., between the fourth target hole group and the fifth target hole group. For another example, the above first virtual hole group may be arranged behind the second target hole group, and the above second virtual hole group may be arranged behind the fifth target hole group and so on.

Figure 5:
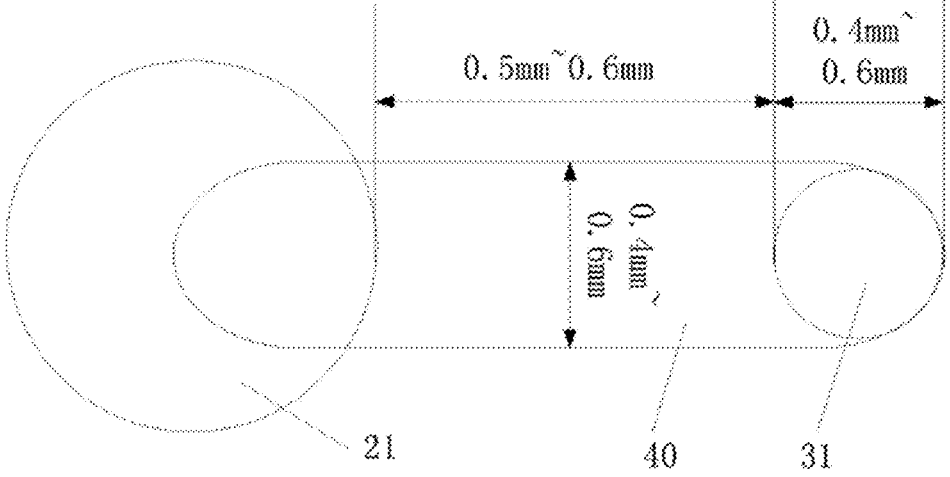
FIG. 5 is a schematic structural diagram of a pad through-hole, a virtual hole and a connecting line according to an embodiment of the present disclosure.

In an embodiment, the diameter (also called an aperture) of the above virtual hole should not be too large or too small. If the aperture of the virtual hole is too large, when entering the wave soldering equipment, the virtual hole will be filled with the solder, resulting in excessive solder application on the virtual hole, thereby leading to no space to accommodate an excess solder of a connected pad through-hole. If the aperture of the virtual hole is too small, the virtual hole are not able to accommodate much solder, thereby resulting in insufficient suction force of the virtual hole, making the excess solder in the pad through-hole flow slowly along the connecting line and unable to draw away all the excess solder. In an embodiment of the present disclosure, as shown in FIG. 5, the diameter of the above virtual hole 31 is arranged to be 0.4 mm to 0.6 mm. In this way, it may be ensured that the virtual holes are essentially not soldered in the wave soldering process, and it may also be ensured that the virtual holes have sufficient suction force to attract the excess solder in the pad through-holes.

Moreover, in the above embodiment, compared with adding a solder-stealing pad on the substrate of the wave soldering device, in order to exert the effect of preventing solder bridging, a length of the solder-stealing pad needs to be arranged to more than 2 mm, causing the problem that the solder-stealing pad occupies a large wiring area. The diameter of the virtual hole in the present disclosure is only 0.4 mm to 0.6 mm. While improving a soldering yield of wave soldering, it may reduce layout area of the wave soldering device.

In some embodiments, the above virtual holes include at least one of the following: through-holes and blind holes. When the above virtual holes are the through-holes, it means that the virtual holes penetrate through both the front surface and the back surface of the substrate; and when the above virtual holes are the blind holes, it means that the virtual holes only penetrate through the front surface of the substrate. The above virtual holes may include only the through-holes, only the blind holes, or both the through-holes and the blind holes. When the above virtual holes include the blind holes, it does not affect layout and wiring on the front surface of the substrate corresponding to the blind holes. As a result, a layout and wiring density of the wave soldering device may be higher, further realizing miniaturization and integration of the wave soldering device.

When the above virtual holes include through-holes, a diameter of the above through-hole is 0.4 mm to 0.5 mm; and when the above virtual holes include blind holes, compared with through-hole, a diameter of the above blind hole may be appropriately increased, and the diameter of the blind hole is 0.5 mm to 0.6 mm.

In an embodiment, when the above virtual holes include the above blind holes, the above wave soldering device further includes: a groove located between the above pad through-holes and corresponding blind holes. One end of the above groove is connected to the above pad through-holes, and the other end of the above groove is connected to the above blind holes. A depth of the above groove gradually increases along a direction close to the above blind holes. In other words, the depth gradually increases along the above second direction. The above connecting lines are located in the above groove. By connecting the pad through-holes and the corresponding blind holes with the groove whose depth increases sequentially, a slope is formed between the pad through-holes and the blind holes. This may further facilitate flow of the excess solder in the pad through-holes to the blind holes, further realizing the effect of the blind holes drawing the excess solder. Moreover, in terms of a manufacturing manner, the groove and the blind holes may be integrally formed, so there is no need to drill holes separately to form blind holes, further simplifying a process for manufacturing the wave soldering device.

In addition, when the above virtual holes include the above through-holes, a groove whose depth gradually increases along a direction close to the above virtual holes may also be arranged between the above pad through-holes and the above virtual holes to facilitate the excess solder to reach the virtual holes along the groove.

In some embodiments, the smaller a spacing between adjacent pad through-holes, the greater a depth of a corresponding blind hole. The above spacing refers to a shortest distance between outer surfaces of two adjacent pad through-holes, and the above depth refers to a depth along a thickness direction of the substrate, the thickness direction of the substrate is along a thickness between the front surface and the back surface of the substrate. Since the smaller the spacing between adjacent pad through-holes, the more solder is applied overall to each pad through-hole and the more likely it is for bridging to occur in the wave soldering process when passing through a wave soldering furnace, then larger space is needed in the blind hole to accommodate the excess solder. In order to ensure that the blind hole has sufficient suction force, the diameter is not too large, and then the blind hole needs to have a sufficient depth to accommodate the excess solder.

In an embodiment, the thickness of the above substrate is generally 1.2 mm. In an embodiment, the depth of the above blind hole is 0.1 mm to 0.6 mm. That is, the depth of the blind hole is less than or equal to half of the thickness of the substrate. This not only avoids excessive solder application during the wave soldering caused by the blind holes being too small but also ensures that the blind holes may effectively accommodate the excess solder, thereby further solving the problem of solder bridging during the soldering process of the wave soldering device in the related art.

The above virtual holes in the present disclosure may be virtual holes of any shape, such as funnel-shaped holes, or shapes similar to rectangles, or other shapes achieved through related processes. In order to further ensure the soldering effect of the wave soldering device, in other embodiments, a diameter of an end of the above virtual hole is a first diameter, a diameter of other positions of the above virtual hole except the above end is a second diameter, and the above first diameter is less than the above second diameter. In an embodiment, when the above virtual hole is the blind hole, the above end is a top of the blind hole. The above first diameter is less than the above second diameter, which indicates that the blind hole is a trapezoid-like structure. When the above virtual hole is the through-hole, the above end is a bottom and a top of the through-hole. The above first diameter is less than the above second diameter, which indicates that the through-hole is a structure with a larger middle part and smaller top and bottom parts. For this kind of virtual hole structure with a small port aperture and a large internal aperture, due to the small port, it is not easy to be soldered in the wave soldering process. That is, solder is less likely to enter the blind hole through the port. Due to the large internal aperture, the excess solder in the pad through-hole may flow smoothly into the virtual hole along the connecting line, further achieving the effect of drawing the excess solder in the pad through-hole.

In some embodiments, as shown in FIG. 5, a spacing between the above pad through-holes 21 and the corresponding virtual holes 31 is 0.5 mm to 0.6 mm. Arranging the spacing between the pad through-holes and the virtual holes between 0.5 mm and 0.6 mm may avoid the problem that if the spacing between the pad through-hole and the virtual hole is too large, the excess solder in the pad through-hole may gradually cool down before it fully reaches the virtual hole, resulting in the situation where the excess solder cannot fully enter the virtual hole. It may also avoid the problem that if the spacing between the pad through-hole and the virtual hole is too small, the excess solder in the pad through-hole may overflow into the virtual hole and fill the virtual hole without flowing in the wave soldering process.

It should be noted that, as shown in FIG. 5, the spacing between the above pad through-holes and the corresponding virtual holes refers to a shortest distance between an outer surface of the pad through-hole and an outer surface of the above virtual hole, and this distance is 0.5 mm to 0.6 mm.

In an embodiment, the above wave soldering device further includes: a component with a pin located on the front surface of the above substrate, and the above pin is located in the above pad through-holes. In the embodiment, the component is soldered to the substrate through a wave soldering process.

In some embodiments, a diameter of the above pin is 0.3 mm to 0.5 mm less than the diameter of the above pad through-hole. This allows the pin to be smoothly inserted into the pad through-holes, and there is still space between the pin and the pad through-holes to accommodate solder connecting the two.

In addition, as shown in FIG. 1, the above wave soldering device further includes: a slot hole 50 located on the above substrate 10 and serves as a fixing hole for the above wave soldering device; and a positioning hole 60 located on the above substrate 10. FIG. 1 shows a slot hole in the shape of a playground. Of course, in an actual production process, those skilled in the art may design the specific shape of the above slot hole according to needs, and may arranged the slot hole in any regular or irregular shape.

In an embodiment, since a high-temperature solder is not able to flow on the ink, in the present disclosure, the above connecting lines include mask opening copper foil. By using the mask opening copper foil to connect the pad through-holes and the virtual holes, the high-temperature solder may flow on the copper foil, thus further ensuring that excess solder in the pad through-holes may successfully reach the virtual holes along the above connecting lines.

In an embodiment, the above connecting lines may be of mask opening copper foil. Of course, in addition to the above mask opening copper foil, the above connecting lines may also be of other metal materials, such as exposed aluminum foil. Those skilled in the art may select an appropriate metal material as a material of the above connecting lines, and the present disclosure does not impose any limitations thereon.

In order to further ensure that the above connecting lines have a good effect of transporting the high-temperature solder and, at the same time, further reduce area occupied by the connecting lines on the back surface of the substrate, in some other embodiments, a width of the above connecting line is 0.4 mm to 0.6 mm. Here, the above width is a width of the above connecting line in a direction perpendicular to the above second direction. In an embodiment of the present disclosure, the width of the above connecting line is essentially the same as the diameter of the above virtual hole to ensure that excess high-temperature solder in the pad through-holes may smoothly reach the virtual holes along the connecting lines.

Of course, in an actual application process, when layout and wiring permit, those skilled in the art may also appropriately increase the width of the above connecting line.

In related applications, for a wave soldering device where a spacing between two adjacent pad through-holes is greater than or equal to 2 mm, a solder-stealing pad is generally added to the wave soldering device to take away a part of solder from the pad through-holes and thus reduce the problem of bridging between pins. However, when the spacing between the two adjacent pad through-holes is less than 2 mm, the added solder-stealing pad has difficulty in taking away excess solder from the pad through-holes. There is still a lot of solder bridging between the pins of the wave soldering device, and the problem of solder bridging is not able to be completely solved.

In response to the above problem, in some other embodiments of the present disclosure, the spacing between any two adjacent pad through-holes is less than 2 mm. In other words, the wave soldering device of the present disclosure may be applied to the wave soldering process of the device whose spacing of the pad through holes is less than 2 mm, and through the structural design of the wave soldering device of the present disclosure, the problem of solder bridging of the wave soldering device whose spacing of the pad through holes is less than 2 mm after the wave soldering may be effectively solved, and it is ensured that the soldering effect of the wave soldering device whose spacing of the pad through holes is less than 2 mm is better and the soldering yield is higher.

The present disclosure also provides a manufacturing method for the above wave soldering device. FIG. 6 is a schematic flow diagram of the manufacturing method for the above wave soldering device according to the embodiment of the present disclosure. As shown in FIG. 6, the manufacturing method for the above wave soldering device includes the following steps:

step S102: providing a substrate including a front surface and a back surface opposite to each other, in an embodiment, the above substrate may be a copper-clad laminate, or a gold-plated board, a paper substrate, an epoxy glass fiber cloth substrate, and substrates of other materials;

step S104: forming, on the back surface of the above substrate, a plurality of pad through-holes penetrating into the front surface of the above substrate, the plurality of pad through-holes are distributed at intervals along a first direction; and step S106, forming a plurality of virtual holes on the back surface of the above substrate, and forming, on the back surface of the above substrate, connecting lines connecting the above pad through-holes and the above virtual holes, the above virtual holes are located on the same side of the above pad through-holes in a one-to-one correspondence, a diameter of the above virtual hole is less than a diameter of the above pad through-hole, a direction from the above pad through-hole to a corresponding virtual hole is a second direction, a direction opposite to a direction of the above wave soldering device entering wave soldering equipment is a third direction, an included angle between the above second direction and the above third direction is less than or equal to 90°, the above third direction is perpendicular to the above first direction, and the above connecting lines are exposed on the back surface of the above substrate.

Through the above steps, first, the substrate is provided; then, the plurality of pad through-holes penetrating through the above substrate are formed on the back surface of the substrate; and finally, the plurality of virtual holes penetrating through the back surface are formed on the back surface of the substrate. The plurality of virtual holes are located on the same side of the corresponding plurality of pad through-holes, and the diameter of the virtual hole is made less than the diameter of the pad through-hole. In addition, the connecting lines connecting the pad through-holes and the virtual holes in a one-to-one correspondence are formed, resulting in a structure where large pad through-holes are connected to small virtual holes. The direction from the above pad through-hole to the above corresponding virtual hole is the second direction, and the direction opposite to the direction of the above wave soldering device entering the wave soldering equipment is a third direction. The included angle between the second direction and the third direction is less than or equal to 90°. In other words, along the direction opposite to the direction of the above wave soldering device entering the wave soldering equipment, i.e., along a flow direction of solder during wave soldering, the above virtual holes are located above, below or behind the above pad through-holes. When the above virtual holes are located behind the above pad through-holes, the above virtual holes may be directly behind or diagonally behind the above pad through-holes. In this way, during the wave soldering with the wave soldering device, excess solder in the pad through-holes may flow along the connecting lines to the corresponding virtual holes. Due to the smaller diameter of the virtual holes, the virtual holes essentially do not get soldered during the wave soldering, allowing the virtual holes to have space to accommodate the excess solder from the pad through-holes. This achieves the effect of drawing away the excess solder from the pad through-holes, solving the problem of bridging between pins caused by excessive solder in the pad through-holes, and ensuring a better soldering effect and a higher soldering yield of the wave soldering device.

The execution order of step S104 and step S106 may be interchanged. That is, step S106 may be executed first, and then step S104 may be executed.

In an embodiment, the above virtual holes are located on the same side of the above pad through-holes in a one-to-one correspondence, which means that the above virtual holes correspond one-to-one to the above pad through-holes, and the virtual holes are all located on the same side of the corresponding pad through-holes. For the convenience of understanding, an example is given as follows: there are three virtual holes, i.e. a first virtual hole, a second virtual hole and a third virtual hole, and there are also three pad through-holes, i.e. a first pad through-hole, a second pad through-hole and a third pad through-hole. The above first virtual hole corresponds to the above first pad through-hole and is located on a right side of the above first pad through-hole; the above second virtual hole corresponds to the above second pad through-hole and is located on a right side of the above second pad through-hole; and the above third virtual hole corresponds to the above third pad through-hole and is located on a right side of the above third pad through-hole. In this case, the above second direction is a direction from left to right. Since the included angle between the third direction and the second direction is less than or equal to 90°, the above third direction is a direction located in the first quadrant and the fourth quadrant, or a positive direction of the y-axis, or a negative direction of the y-axis.

In addition, the above third direction is also the flow direction of the solder during the wave soldering. The included angle between the above second direction and the above third direction is less than 90°, which means that along the third direction, the virtual holes are located behind the corresponding pad through-holes. The virtual holes may be located directly behind (corresponding to an included angle of) 0° or diagonally behind (corresponding to a non-0° included angle less than) 90° the corresponding pad through-holes. The included angle between the above second direction and the above third direction is equal to 90°, which means that the above second direction coincides with the above first direction, and the virtual holes are located on a side of the pad through-holes along the first direction.

It should be noted that the above connecting lines are exposed on the back surface of the above substrate. In other words, surfaces of the above connecting lines are not covered with ink.

The plurality of virtual holes may be distributed at intervals along the above first direction; and the plurality of virtual holes may also be arranged in a staggered manner instead of being regularly arranged along the above first direction. The plurality of virtual holes may be flexibly arranged according to a routing situation on the substrate, as long as the virtual holes are located behind the corresponding pad through-holes along the third direction and avoid a routing area.

In an embodiment, the above virtual holes may penetrate from the back surface of the above substrate to the front surface of the substrate, or penetrate from the back surface of the above substrate into the above substrate without penetrating through the front surface of the substrate. One end of the above connecting line connecting the above pad through-hole and the above virtual hole is located in the above pad through-hole, and the other end is located in the above virtual hole. The included angle between the above second direction and the above third direction may be arranged to angles such as 10°, 15°, 20° and 45°. Since the substrate is generally in a regular rectangular shape, in order to ensure that an overall occupied area of the pad through-holes and the virtual holes is relatively small, so as to increase a wiring area for other signal traces of the wave soldering device and further realize miniaturization and integration design of the wave soldering device, in some embodiments, as shown in FIG. 1, the included angle between the above second direction and the above third direction is 0°. In other words, the above second direction is parallel to the above third direction.

In an embodiment, the plurality of pad through-holes distributed at intervals along the above first direction form one target hole group. The forming, on the back surface of the above substrate, a plurality of pad through-holes penetrating into the front surface of the above substrate includes: forming a plurality of target hole groups in sequence along the third direction, each of the target hole groups includes the plurality of pad through-holes distributed at intervals along the first direction. The forming a plurality of virtual holes on the back surface of the substrate includes: forming a virtual hole group at an end of the above target hole group along the above third direction. That is, the above virtual hole group is located on the same side of each of the target hole groups. The above virtual hole group includes the plurality of virtual holes, and the virtual holes correspond one-to-one to the above pad through-holes in the above target hole group located in a last row along the third direction. In the embodiment, when the above wave soldering device includes at least two rows of pad through-holes, along the third direction, except pad through-holes in a last row, pad through-holes in other rows are arranged conventionally without design of connecting large through-holes to small virtual holes. Only a row of virtual holes is formed behind the pad through-holes in the last row. During the wave soldering, the excessive solder in the pad through-holes in the last row will flow through the connecting lines into corresponding virtual holes, reducing solder in the pad through-holes in the last row. This may avoid the problem of bridging between the pad through-holes in the last row and between the pad through-holes in the last row and pad through-holes in an adjacent row, thereby further avoiding the problem of bridging between pins. Since there is only a row of virtual hole groups, it may also prevent the virtual hole groups from occupying excessive substrate area, thereby facilitating design of other signal traces of the wave soldering device and realizing the miniaturization design of the wave soldering device.

In some other embodiments of the present disclosure, the plurality of pad through-holes distributed at intervals along the above first direction form one target hole group. The forming, on the back surface of the above substrate, a plurality of pad through-holes penetrating into the front surface of the above substrate includes: forming a plurality of target hole groups in sequence along the third direction, each of the target hole groups includes the plurality of pad through-holes distributed at intervals along the first direction. The forming a plurality of virtual holes on the back surface of the substrate includes: forming one virtual hole group behind each of the above target hole groups along the above third direction, the above virtual hole group includes the plurality of virtual holes. That is, the above target hole groups and the above virtual hole groups are alternately distributed at intervals along the above third direction. In other words, a first row of target hole groups, a first row of virtual hole groups, a second row of target hole groups, a second row of virtual hole groups, . . . are arranged in sequence along the third direction. Through the virtual holes in each row, excess solder in each row of pad through-holes may be drawn, further solving the problem of solder bridging.

Due to limitations of layout and wiring, In an embodiment, when there are a plurality of target hole groups, it is impossible to arrange corresponding virtual hole groups behind each target hole group along the above third direction. In this case, in order to further avoid the problem of solder bridging and further realize the miniaturization of the wave soldering device, according to other embodiments of the present disclosure, the above wave soldering device includes a first quantity of the above target hole groups and a second quantity of the above virtual hole groups. The above first quantity is greater than the above second quantity. The plurality of target hole groups are distributed at intervals along the above third direction. The second quantity of the above target hole groups distributed at the tail along the above third direction and the above virtual hole groups are alternately distributed at intervals along the above third direction. In the above embodiments of the present disclosure, when there are a plurality of rows of target hole groups, along the flow direction of the solder during the wave soldering (i.e., the above third direction), the virtual hole groups are only arranged behind last few rows of target hole groups. While further avoiding the problem of solder bridging, it also prevents excessive virtual hole groups from occupying layout and wiring area of the wave soldering device, thereby further realizing the miniaturization design of the wave soldering device.

In some embodiments, the forming a plurality of virtual holes on the back surface of the above substrate, and the forming, on the back surface of the above substrate, connecting lines connecting the above pad through-holes and the above virtual holes include: correspondingly forming, on the same side of each of the above pad through-holes by using a drill bit, blind holes penetrating into the above substrate to obtain the above virtual holes; and forming the above connecting lines connecting the above pad through-holes and the above virtual holes. In the embodiment, the plurality of virtual holes are obtained first by drilling, and then the connecting lines connecting the pad through-holes and the virtual holes are formed, further realizing a structure of connecting large pad through-holes to small virtual holes. It further ensures that the small virtual holes may essentially draw excess solder of the pad through-holes located in a front row of the virtual holes in the above third direction after the wave soldering, further effectively preventing the problem of solder bridging between pins of the wave soldering device with a small spacing, and further improving the soldering yield of the wave soldering.

In an embodiment, for the correspondingly forming, on the same side of each of the above plurality of pad through-holes by using a drill bit, the above drill bit may be configured to correspondingly form the above blind holes penetrating into the substrate on the same side of each of the plurality of pad through-holes through a back drilling process.

Of course, in addition to the above manufacturing method, those skilled in the art may also use other suitable methods to form the above virtual holes and the above connecting lines. In an embodiment, a specific implementation of step S106: forming a plurality of virtual holes on the back surface of the above substrate, and forming, on the above back surface of the substrate, connecting lines connecting the above pad through-holes and the above virtual holes may also be: forming a plurality of connecting lines on the back surface of the above substrate along the above second direction, one end of the above connecting line is located in the above pad through-hole in a one-to-one correspondence; and forming blind holes penetrating into the above substrate at the other end of each of the above connecting lines by laser drilling technology, so that the above connecting lines are located in the above blind holes, thereby obtaining the plurality of virtual holes. In the embodiment, the connecting lines are formed first, and then the plurality of virtual holes are formed at the other end of the connecting lines through the laser drilling technology. In this way, there is no need to electroplate copper after drilling holes to achieve connection between the virtual holes and the connecting lines.

In order to further simplify the process for manufacturing the above wave soldering device, in other embodiments, the forming a plurality of virtual holes on the above back surface of the substrate, and the forming, on the back surface of the above substrate, connecting lines connecting the above pad through-holes and the above virtual holes include: removing a part of the above substrate starting from each of the above pad through-holes along the above second direction by using a milling cutter to form a plurality of preliminary grooves with sequentially increasing depths, forming blind holes at ends of the above preliminary grooves to obtain the above virtual holes, and forming grooves with remaining preliminary grooves; and forming the above connecting lines in each of the above grooves in a one-to-one correspondence. In the embodiment, in a process of forming the routing grooves of the above connecting lines, by gradually increasing the depths of the routing grooves, the ends of the routing grooves with the required depths are obtained as the virtual holes. In this way, there is no need to drill holes to form the virtual holes, further ensuring that the above wave soldering device may be easily obtained and reducing the manufacturing cost of the above wave soldering device.

In an embodiment, during the manufacturing process, a depth and a deviation of the blind holes need to be strictly controlled to avoid the problem of connection short circuit between the connecting lines and copper foil of other networks on the substrate when the connecting lines are formed by electroplating copper.

In some embodiments of the present disclosure, the above virtual holes include the blind holes. By designing the virtual holes as the blind holes, it does not affect layout and wiring on the front surface of the substrate corresponding to the blind holes. As a result, a layout and wiring density of the wave soldering device may be higher, further realizing miniaturization and integration of the wave soldering device.

In addition to the above blind holes, the above virtual holes may also be the through-holes. In some solutions, the forming a plurality of virtual holes on the back surface of the above substrate includes: forming, on the back surface of the above substrate, a plurality of through-holes penetrating through the front surface of the above substrate to obtain the above virtual holes.

In addition, the forming, on the back surface of the above substrate, connecting lines connecting the above pad through-holes and the above virtual holes includes: forming the above connecting lines on the back surface of the above substrate through an electroplating process.

In an embodiment, the diameter (also called an aperture) of the above virtual hole should not be too large or too small. If the aperture of the virtual hole is too large, when entering the wave soldering equipment, the virtual hole will be filled with the solder, resulting in excessive solder application on the virtual hole, thereby leading to no space to accommodate excess solder of a connected pad through-hole. If the aperture of the virtual hole is too small, the virtual hole cannot accommodate much solder, thereby resulting in insufficient suction force of the virtual hole, making excess solder in the pad through-hole flow slowly along the connecting line and unable to draw away all the excess solder. In an embodiment of the present disclosure, as shown in FIG. 5, the diameter of the above virtual hole 31 is arranged to be 0.4 mm to 0.6 mm. In this way, it may be ensured that the virtual holes are essentially not soldered in the wave soldering process, and it may also be ensured that the virtual holes have sufficient suction force to attract excess solder in the pad through-holes.

When the above virtual holes include through-holes, a diameter of the above through-hole is 0.4 mm to 0.5 mm; and when the above virtual holes include blind holes, compared with through-hole, a diameter of the above blind hole may be appropriately increased, and the diameter of the blind hole is 0.5 mm to 0.6 mm.

In an embodiment, the thickness of the above substrate is generally 1.2 mm. In an embodiment, the depth of the above blind hole is 0.1 mm to 0.6 mm. That is, the depth of the blind hole is less than or equal to half of the thickness of the substrate. This not only avoids excessive solder application during the wave soldering caused by the blind holes being too small but also ensures that the blind holes may effectively accommodate the excess solder, thereby further solving the problem of solder bridging during the soldering process of the wave soldering device in the related art.

In some embodiments, the smaller a spacing between adjacent pad through-holes, the greater a depth of a corresponding blind hole. The above spacing refers to a shortest distance between outer surfaces of two adjacent pad through-holes, and the above depth refers to a depth along a thickness direction of the substrate, the thickness direction of the substrate is along a thickness between the front surface and the back surface of the substrate. Since the smaller the spacing between adjacent pad through-holes, the more solder is applied overall to each pad through-hole and the more likely it is for bridging to occur in the wave soldering process when passing through a wave soldering furnace, then larger space is needed in the blind hole to accommodate excess solder. In order to ensure that the blind hole has sufficient suction force, the diameter cannot be too large, and then the blind hole needs to have a sufficient depth to accommodate the excess solder.

The above virtual holes in the present disclosure may be virtual holes of any shape, such as funnel-shaped holes, or shapes similar to rectangles, or other shapes achieved through related processes. In order to further ensure the soldering effect of the wave soldering device, in other embodiments, a diameter of an end of the above virtual hole is a first diameter, a diameter of another position of the above virtual hole except the above end is a second diameter, and the above first diameter is less than the above second diameter. In an embodiment, when the above virtual hole is the blind hole, the above end is a top of the blind hole. The above first diameter is less than the above second diameter, which indicates that the blind hole is a trapezoid-like structure. When the above virtual hole is the through-hole, the above end is a bottom and a top of the through-hole. The above first diameter is less than the above second diameter, which indicates that the through-hole is a structure with a larger middle part and smaller top and bottom parts. For this kind of virtual hole structure with a small port aperture and a large internal aperture, due to the small port, it is not easy to be soldered in the wave soldering process. That is, solder is less likely to enter the blind hole through the port. Due to the large internal aperture, excess solder in the pad through-hole may flow smoothly into the virtual hole along the connecting line, further achieving the effect of drawing the excess solder in the pad through-hole.

In some embodiments, a spacing between the above pad through-hole and the above corresponding virtual hole is 0.5 mm to 0.6 mm. A width of the above connecting line is 0.4 mm to 0.6 mm. A spacing between any two adjacent pad through-holes is less than 2 mm.

In some embodiments, the above manufacturing method further includes: forming a component with pins on the front surface of the above substrate, so that the above pins are located in the above pad through-holes in a one-to-one correspondence.

According to another embodiment of the present disclosure, a printed circuit board is further provided, including: any one of the above wave soldering devices, or including a wave soldering device manufactured by using any one of the above manufacturing methods.

The above printed circuit board includes any one of the above wave soldering devices or a wave soldering device manufactured by using the above method. In the wave soldering device, the plurality of virtual holes are arranged on the same side of the plurality of pad through-holes distributed at intervals along the first direction on the substrate, and the diameter of the virtual hole is less than the diameter of the pad through-hole. The pad through-holes and the virtual holes are connected in a one-to-one correspondence by connecting lines located on the back surface of the substrate, resulting in a structure where large pad through-holes are connected to small virtual holes. The direction from the above pad through-hole to the above corresponding virtual hole is the second direction, and the direction opposite to the direction of the above wave soldering device entering the wave soldering equipment is a third direction. The included angle between the second direction and the third direction is less than or equal to 90°. In other words, along the direction opposite to the direction of the above wave soldering device entering the wave soldering equipment, i.e., along a flow direction of solder during wave soldering, the above virtual holes are located above, below or behind the above pad through-holes. When the above virtual holes are located behind the above pad through-holes, the above virtual holes may be directly behind or diagonally behind the above pad through-holes. In this way, during the wave soldering with the wave soldering device, excess solder in the pad through-holes may flow along the connecting lines to the corresponding virtual holes. Due to the smaller diameter of the virtual holes, the virtual holes essentially do not get soldered during the wave soldering, allowing the virtual holes to have space to accommodate the excess solder from the pad through-holes. This achieves the effect of drawing away the excess solder from the pad through-holes, solving the problem of bridging between pins caused by excessive solder in the pad through-holes, and ensuring a better soldering effect of the wave soldering device, thereby ensuring a higher overall manufacturing yield of the printed circuit board.

Through the description of the above implementations, those skilled in the art may clearly understand that the method according to the above embodiments may be implemented by means of software plus a necessary general hardware platform. Of course, the method may also be implemented by hardware, but in many cases, the former is a more preferred implementation. Based on such an understanding, the technical solution of the present disclosure, in essence, or the part that contributes to the prior art may be embodied in the form of a software product. The computer software product is stored in a non-volatile readable storage medium (such as ROM (read-only memory), RAM (random access memory), magnetic disk, optical disk), and includes several instructions for enabling a terminal device (which may be a mobile phone, a computer, a server, or a network device, etc.) to execute the methods described in the above embodiments of the present disclosure.

The present disclosure may refer to the above embodiments and implementations, and details are not repeated here In the embodiment.

Obviously, those skilled in the art should understand that above modules or steps of the present disclosure may be implemented by a general computing device. They may be centralized on a single computing device or distributed on a network composed of multiple computing devices. They may be implemented by program codes executable by the computing device. Therefore, they may be stored in a storage device and executed by the computing device. Moreover, in some cases, the steps shown or described may be executed in an order different from that here, or they may be respectively fabricated into individual integrated circuit modules, or multiple modules or steps among them may be fabricated into a single integrated circuit module for implementation. In this way, the present disclosure is not limited to any specific combination of hardware and software.

The above are merely specific embodiments of the present disclosure and are not intended to limit the present disclosure. For those skilled in the art, various changes and modifications may be made to the present disclosure. Any modifications, equivalent substitutions, improvements, etc. made within the principles of the present disclosure shall be included within the scope of protection of the present disclosure.

What is claimed is:

1. A wave soldering device, comprising:

a substrate comprising a front surface and a back surface opposite to each other;

a target hole group comprising a pad through-hole, wherein a plurality of pad through-holes are provided and distributed at intervals along a first direction, the plurality of pad through-holes penetrate through the front surface of the substrate and the back surface of the substrate;

a virtual hole group comprising a virtual hole, wherein a plurality of virtual holes are provided, and the plurality of virtual holes penetrate through the back surface of the substrate, the plurality of virtual holes are located on the same side of the plurality of pad through-holes in a one-to-one correspondence, a diameter of the virtual hole is less than a diameter of the pad through-hole, a direction from the pad through-hole to the corresponding virtual hole is a second direction, a direction opposite to a direction of the wave soldering device entering a wave soldering equipment is a third direction, an included angle between the second direction and the third direction is less than or equal to 90°, and the third direction is perpendicular to the first direction; and a connecting line, wherein a plurality of connecting lines are provided and located on the back surface of the substrate, the plurality of virtual holes and the plurality of pad through-holes are connected in a one-to-one correspondence through the plurality of connecting lines.

2. The wave soldering device according to claim 1, wherein there are at least two target hole groups, the at least two target hole groups are distributed at intervals along the third direction, and the virtual hole group is located on the same side of the at least two target hole groups.

3. The wave soldering device according to claim 1, wherein there are a plurality of target hole groups and a plurality of virtual hole groups, and the plurality of target hole groups and the plurality of virtual hole groups are alternately distributed at intervals along the third direction.

4. The wave soldering device according to claim 1, wherein the wave soldering device comprises a first quantity of the target hole groups and a second quantity of the virtual hole groups, the first quantity is greater than the second quantity, the first quantity of the target hole groups are distributed at intervals along the third direction, and the second quantity of the target hole groups distributed at a tail along the third direction and the second quantity of the virtual hole groups are alternately distributed at intervals along the third direction.

5. The wave soldering device according to claim 1, wherein the plurality of virtual holes comprise at least one of the following: a through-hole and a blind hole.

6. The wave soldering device according to claim 5, wherein in response to the plurality of virtual holes comprise the blind hole, the wave soldering device further comprises:

a groove located between the pad through-hole and the corresponding blind hole, wherein one end of the groove is in communication with the pad through-hole, the other end of the groove is in communication with the blind hole, a depth of the groove gradually increases along a direction close to the blind hole, and the connecting line is located in the groove.

7. The wave soldering device according to claim 5, wherein in response to the plurality of virtual holes comprise the blind hole, the smaller a spacing between adjacent pad through-holes, the greater a depth of the corresponding blind hole.

8. The wave soldering device according to claim 5, wherein in response to the plurality of virtual holes comprise the blind hole, a depth of the blind hole is 0.1 mm to 0.6 mm.

9. The wave soldering device according to claim 1, wherein a diameter of an end of the virtual hole is a first diameter, a diameter of other positions of the virtual hole except the end is a second diameter, and the first diameter is less than the second diameter; and/or the diameter of the virtual hole is 0.4 mm to 0.6 mm; and/or a spacing between the plurality of pad through-holes and the corresponding plurality of virtual holes is 0.5 mm to 0.6 mm; and/or a width of the plurality of connecting line is 0.4 mm to 0.6 mm; and/or a spacing between any two adjacent pad through-holes is less than 2 mm.

10. The wave soldering device according to claim 1, wherein the wave soldering device further comprises:

a component with a pin located on the front surface of the substrate, wherein the pin is located in the pad through-hole.

11. The wave soldering device according to claim 10, wherein a diameter of the pin is 0.3 mm to 0.5 mm less than the diameter of the pad through-hole.

12. The wave soldering device according to claim 1, wherein the connecting line comprise mask opening copper foil.

13. The wave soldering device according to claim 1, wherein the second direction is parallel to the third direction.

14. A manufacturing method for the wave soldering device according to claim 1, comprising:

providing a substrate comprising a front surface and a back surface opposite to each other;

forming, on the back surface of the substrate, a pad through-hole penetrating into the front surface of the substrate, wherein a plurality of pad through-holes are provided, and the plurality of pad through-holes are distributed at intervals along a first direction; and forming a virtual hole on the back surface of the substrate, wherein a plurality of virtual holes are provided, and forming, on the back surface of the substrate, a connecting line connecting the pad through-hole and the virtual hole, the plurality of virtual holes are located on the same side of the plurality of pad through-holes in a one-to-one correspondence, a diameter of the virtual hole is less than a diameter of the pad through-hole, a direction from the pad through-hole to the corresponding virtual hole is a second direction, a direction opposite to a direction of the wave soldering device entering wave soldering equipment is a third direction, an included angle between the second direction and the third direction is less than or equal to 90°, the third direction is perpendicular to the first direction, and the connecting lines are exposed on the back surface of the substrate.

15. The manufacturing method according to claim 14, wherein in a step of forming the plurality of virtual holes on the back surface of the substrate and forming, on the back surface of the substrate, the connecting line connecting the pad through-hole and the virtual hole, the manufacturing method comprise:

forming a plurality of connecting lines on the back surface of the substrate along the second direction, and first ends of the plurality of connecting lines are located in the plurality of pad through-holes in a one-to-one correspondence; and forming a blind hole penetrating into the substrate at a second end of each of the plurality of connecting lines by laser drilling technology, so that the second end of each of the plurality of connecting lines is located in the blind hole, thereby obtaining the plurality of virtual holes.

16. The manufacturing method according to claim 14, wherein in a step of forming the plurality of virtual holes on the back surface of the substrate and forming, on the back surface of the substrate, a connecting line connecting the pad through-hole and the virtual hole, the manufacturing method comprise:

correspondingly forming, on the same side of each of the plurality of pad through-holes by using a drill bit, a blind hole penetrating into the substrate to obtain the plurality of virtual holes; and forming the connecting line connecting the pad through-hole and the virtual hole.

17. The manufacturing method according to claim 14, wherein in a step of forming the plurality of virtual holes on the back surface of the substrate and forming, on the back surface of the substrate, the connecting line connecting the pad through-hole and the virtual hole, the manufacturing method comprise:

removing a part of the substrate starting from each of the plurality of pad through-holes along the second direction by using a milling cutter to form a plurality of preliminary grooves with sequentially increasing depths, forming blind holes at ends of the plurality of preliminary grooves to obtain the plurality of virtual holes, and forming grooves with remaining preliminary grooves; and forming a plurality of connecting lines are provided in each of the grooves in a one-to-one correspondence.

18. The manufacturing method according to claim 14, wherein in a step of forming the plurality of virtual holes on the back surface of the substrate, the manufacturing method comprises:

forming, on the back surface of the substrate, a plurality of through-holes penetrating through the front surface of the substrate to obtain the plurality of virtual holes.

19. A printed circuit board, comprising a wave soldering device manufactured by using the manufacturing method according to claim 14.

20. A printed circuit board, comprising: the wave soldering device according to claim 1.

*   *   *   *   *